United States Patent
Cheng et al.

(10) Patent No.: US 7,662,426 B2
(45) Date of Patent: Feb. 16, 2010

(54) METHOD OF FABRICATING ORGANIC LIGHT EMITTING DIODE ARRAY

(75) Inventors: Jungwei John Cheng, Chia-Yi (TW); Jeng-Rong Ho, Chia-Yi (TW); Tzu-Yang Peng, Chia-Yi (TW); Nan-Yi Wu, Chia-Yi (TW); Chin Min Huang, Chia-Yi (TW)

(73) Assignee: National Chung Chen University, Chia-Yi (TW)

( * ) Notice: Subject to any disclaimer, the term of this patent is extended or adjusted under 35 U.S.C. 154(b) by 708 days.

(21) Appl. No.: 11/304,561

(22) Filed: Dec. 16, 2005

(65) Prior Publication Data

US 2007/0141234 A1  Jun. 21, 2007

(30) Foreign Application Priority Data

Jan. 21, 2005  (TW) ................ 94101833 A

(51) Int. Cl.
*B05D 5/06* (2006.01)
*B05D 3/12* (2006.01)
*B05D 1/32* (2006.01)

(52) U.S. Cl. ................. 427/66; 427/72; 427/240; 427/259; 445/24; 428/917; 313/504

(58) Field of Classification Search .......... 427/66, 427/72, 240, 259; 445/24; 428/917; 313/504
See application file for complete search history.

(56) References Cited

U.S. PATENT DOCUMENTS

2001/0019245 A1* 9/2001 Ohshita et al. .............. 313/506
2004/0227159 A1* 11/2004 Nakashima et al. ......... 257/202

OTHER PUBLICATIONS

J. Birnstock, et al., "Screen-printed passive matrix displays based on light-emitting polymers", Applied Physics Letters, vol. 78, No. 24, Jun. 11, 2001, pp. 3905-3907.
Chang, et al., "Dual-color polymer light-emitting pixels processed by hybrid inkjet printing," Applied Physics Letters, vol. 73, No. 18, Nov. 2, 1998, pp. 2561-2563.
Müller, et al., "Mulit-colour organic light emitting displays by solution processing", Nature, vol. 421, Feb. 20, 2003, pp. 829-833.

* cited by examiner

*Primary Examiner*—Timothy H Meeks
*Assistant Examiner*—Jimmy Lin
(74) *Attorney, Agent, or Firm*—Rosenberg, Klein & Lee

(57) ABSTRACT

The present invention discloses a method of fabricating organic light emitting diode array, which adopts a directional spin coating technology to grow different organic light-emitting materials on the same plane so as to control the color of the emitted light and accomplish monochrome or full color organic light emitting diodes.

12 Claims, 19 Drawing Sheets

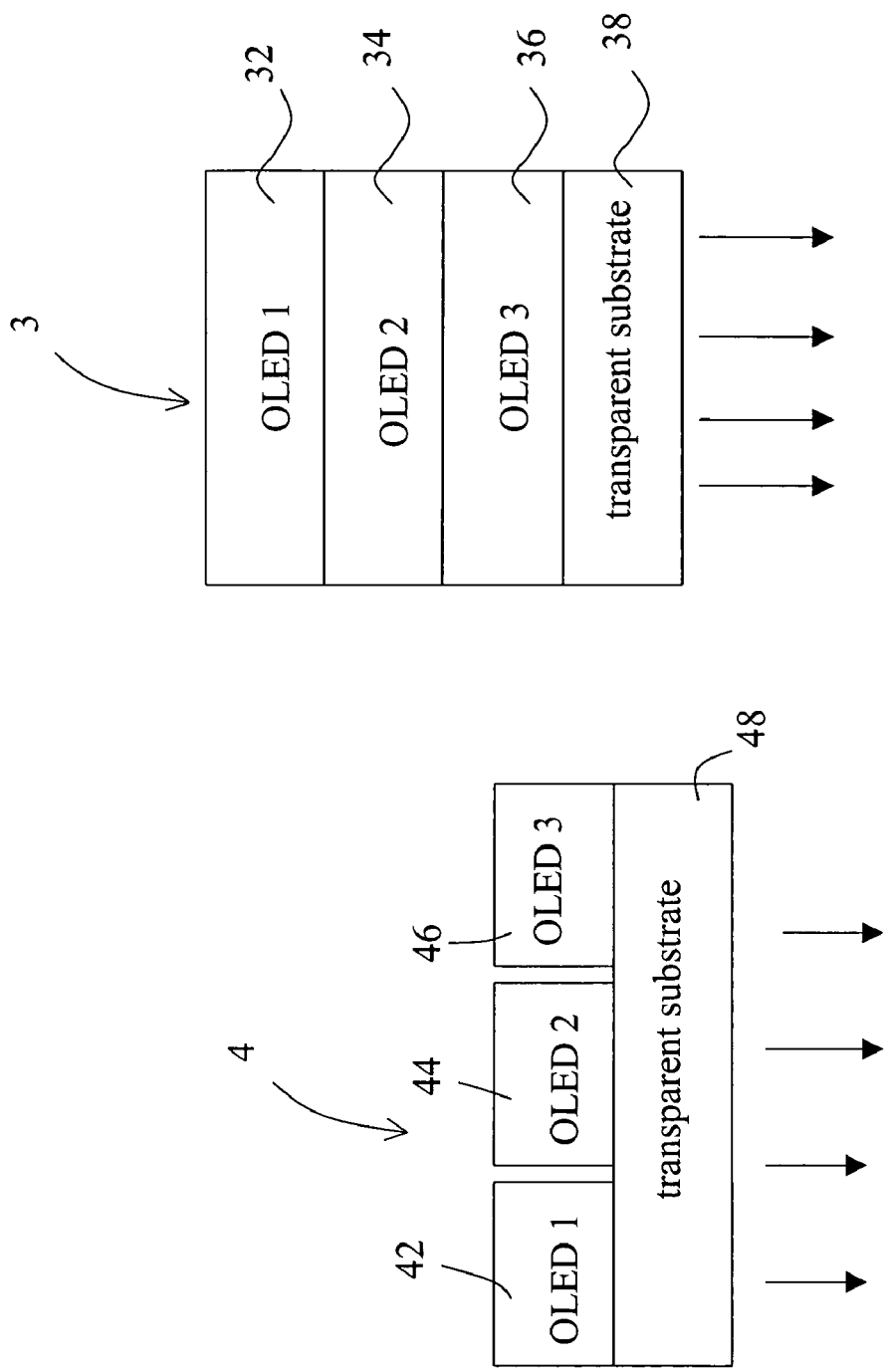

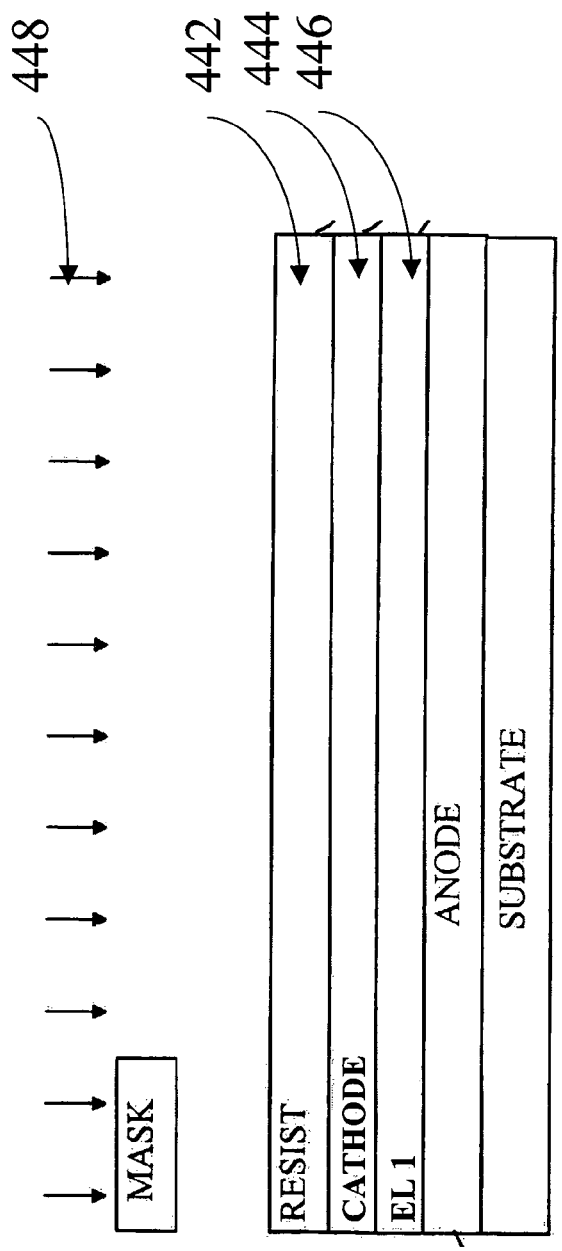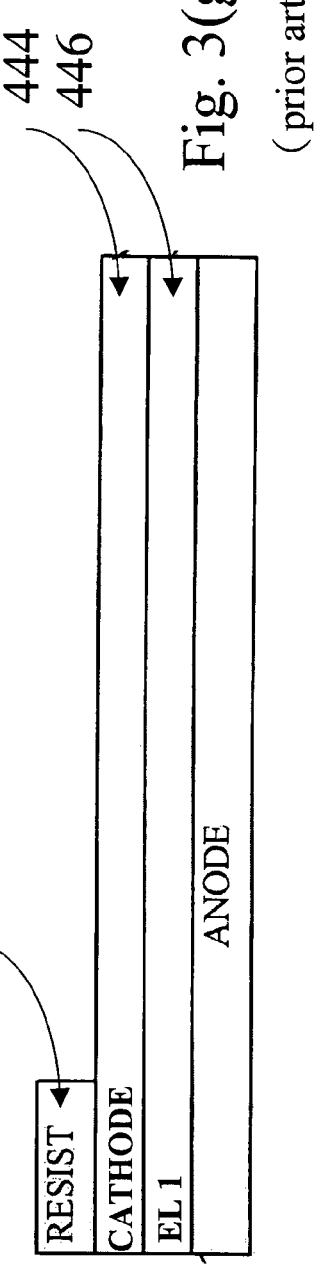
Fig. 3(f) (prior art)
Fig. 3(g) (prior art)

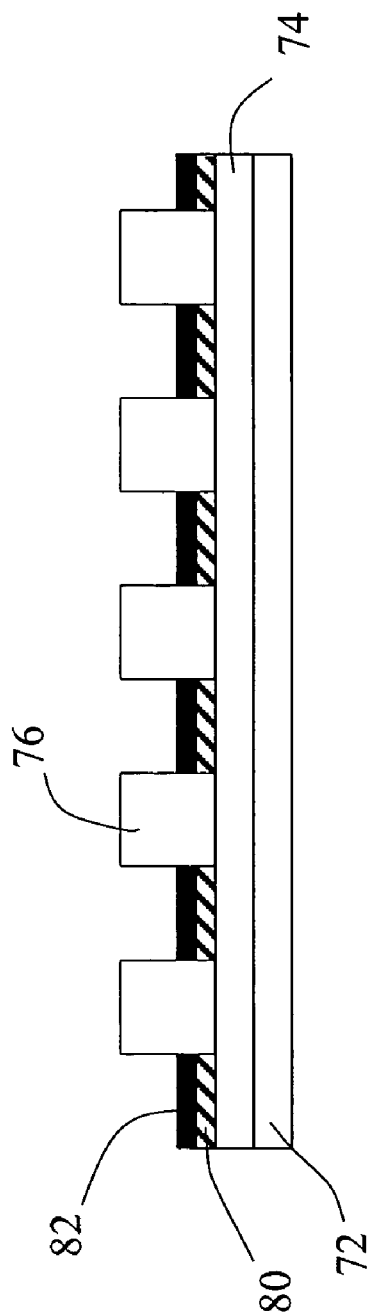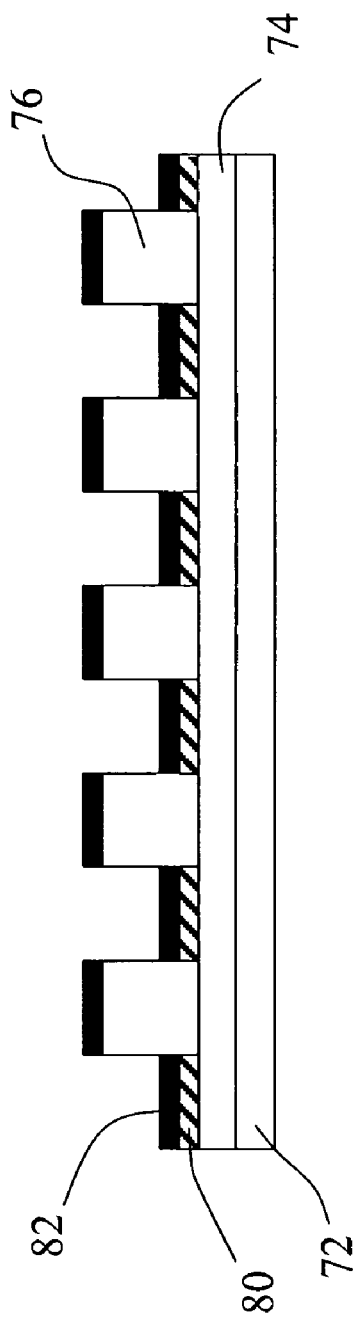
Fig. 5(d1)
Fig. 5(d2)

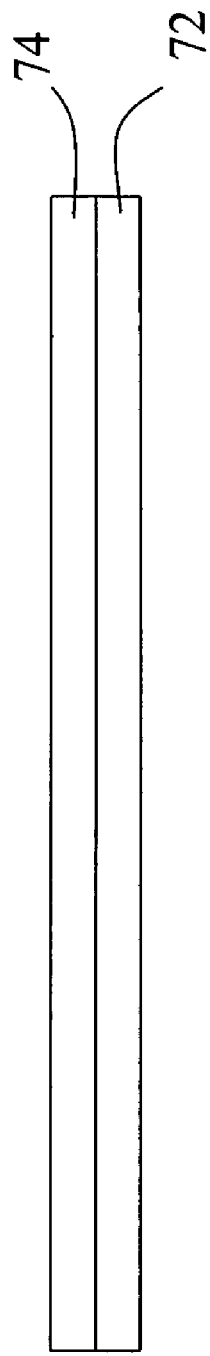
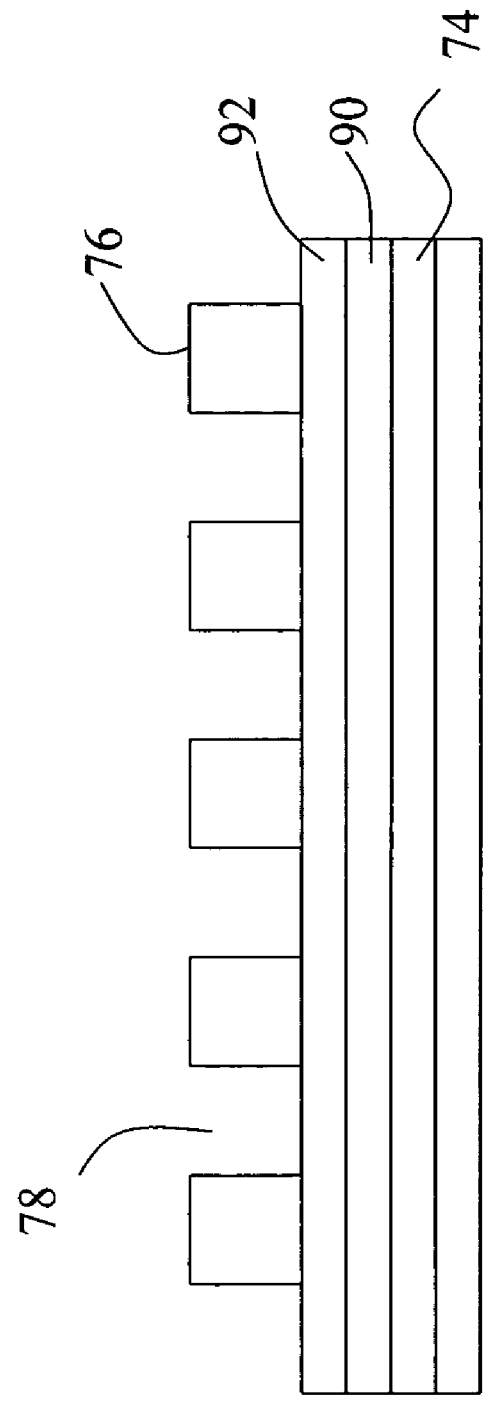
Fig. 7(a)
Fig. 7(b)

METHOD OF FABRICATING ORGANIC LIGHT EMITTING DIODE ARRAY

BACKGROUND OF THE INVENTION

1. Field of the Invention

The present invention relates to a method of fabricating organic light emitting diode array, particularly to the one that adopts a directional spin coating technology.

2. Description of the Related Art

The characteristic of an organic light emitting diode (OLED) is that the material of its electro-luminescent (EL) layer is a small discrete organic molecule such as aluminum tris(8-hydroxyquinoline) (Alq3) or an organic polymer such as polyfluorene (PF). Refer to FIG. 1 the schematic diagram of a conventional OLED 1. As shown in FIG. 1, the conventional OLED 1 includes the following elements in top-down sequence: an encapsulating layer 12, which isolates the OLED 1 from the environment; a cathode 14; an organic light emitter 16; a transparent anode 18; and a transparent substrate 20, whose material may be a glass or a transparent plastic. In a general OLED, only the anode is transparent; however, there is also OLED having a transparent cathode or having transparent anode and cathode. FIG. 1(a) is the schematic diagram of the detailed structure of the organic light emitter 16. As shown in FIG. 1(a), the organic light emitter 16 includes the following elements in top-down sequence: an electron injection layer (EIL) 161, an electron transport layer (ETL) 162, an electro-luminescent (EL) layer 163, a hole transport layer (HTL) 164, and a hole injection layer (HIL) 165. Except the EL layer 163, other layers of the organic light emitter 16 are optional, depending on designer's choice.

The structures of full color OLED display devices can be divided into a stack one and a parallel one. Referring to FIG. 2(a) the schematic diagram of a stack structured full color OLED display device 3, herein, three OLEDs 32, 34, and 36, which emit red (R), green (G), and blue (B) lights respectively, are stacked on a substrate 38 to form a unitary full color pixel. There are three types of parallel structured full color OLED display devices. Referring to FIG. 2(b) the schematic diagram of the first type parallel structured full color OLED display device 4, herein, three OLEDs 42, 44, 46, which emit R, G, and B lights respectively, are disposed on a substrate 48 to form a unitary full color pixel. Referring to FIG. 2(c) the schematic diagram of the second type parallel structured full color OLED display device 5, herein, a white-light light source 52 in cooperation with three color filters 54, 56, and 58 creates R, G, and B lights. Referring to FIG. 2(d) the schematic diagram of the third type parallel structured full color OLED display device 6, herein, three color conversion elements 64, 66, and 68 convert the light emitted by a light source 62 and of a specific frequency into R, G, and B lights.

A few methods exist for fabricating OLEDs. Thermal evaporation is the de facto choice for fabrication of small molecular OLEDs. For fabrication of polymeric OLEDs, two approaches are commonly used. For monochrome OLEDs, the simple spin coating method is universally adopted. When addressing full color OLEDs, the inkjet printing method is the first choice coming to designer's mind. The conventional spin coating approach is a simple and inexpensive fabrication method; however, it cannot be utilized to fabricate full color OLEDs, as it can coat only one thin film on the substrate and lacks the ability to coat polymers into arbitrarily geometrical patterns. Feasibility of the inkjet printing method for fabrication of full color polymeric OLEDs was first demonstrated in [CBY98], which reported dual-color polymeric OLED pixels involving a spin-coated EL layer with blue emission topped by inkjet printed EL dots with red-orange emission. Custom-design and careful selection of the EL materials are necessary for the success of the inkjet printed full color OLEDs.

Limitation of the thermal evaporation method to small-size OLED displays, inability of the spin coating approach for full color OLED displays, and the fact that the inkjet printing technique is still at laboratory prototyping stage prompt many activities on alternative methods. Proposals directly addressing patterning of the EL layer for fabrication of full color or multi-color OLED displays include methods of thermal transfer [WBF03, HS02, CSS01 and references therein], electrochemical polymerization [ZWW03], photolithography using UV curable EL polymers [MFR03], screen printing [BBH01], and photolithography based on a new photoresist of a photoacid generating material and heat labile monomers [She01]. In the following, a brief review of these alternative methods is prepared by calling upon each method to selectively deposit the R, G, and B EL layers as shown in FIG. 3(a) which depicts a half complete, parallel structured full color OLED consisting of a substrate 102, an anode layer 104, an optional HIL 122, an optional HTL 124, and three discretely deposited EL patterns 126, emitting R, B, and G lights respectively.

FIG. 3(b) illustrates how discrete deposition of an EL pattern is achieved using the thermal transfer method. The key component of the thermal transfer method is a donor element 400 which, in one of many possible embodiments [WBF03], consists of a donor substrate 401, a light-to-heat conversion layer 402, and a transfer layer 403. For our application, the transfer layer is made of an EL material. With light radiation 406 through a mask 405, a part 404 of the EL transfer layer is transferred onto the HTL 124 due to the heat converted by the light-to-heat conversion layer. The half complete full color PLED is accomplished by repeating the same process for another two EL patterns.

FIG. 3(c) describes how the electrochemical polymerization method operates. The substrate 102 with patterned anode 104 is used as the positive electrode. Mononers of the desired EL polymer are dissolved in the electrolyte 412. When a voltage source 416 is applied to the patterned anode and a negative electrode 414, the monomers are oxidized, resulting in positively charged polymers selectively deposited on the patterned anode. Neutralization of the positively charged polymers is not necessary but it does give rise to an OLED device with "superior" performance [ZWW03]. Since electrochemical polymerization requires deposition on the electrode, the fabricated OLED device can not contain either HIL or HTL layer. Repeating the same process for another two EL patterns makes the half complete full color OLED.

FIG. 3(d) shows how, with specially synthesized UV curable EL polymers, traditional photolithography is applied to fabrication of full color OLED devices. The UV curable EL polymers are soluble before UV curing and become insoluble when photochemically crosslinked. For OLED applications, the UV curable EL material of one type is spun coated on top of the HTL layer. UV radiation 426 is then applied through a mask 424. A discrete EL pattern 126 is created after washing away the uncured non-crosslinked part 422. Repeated applications of the photolithography process gives rise to the needed R, G, and B patterns.

FIG. 3(e) shows a schematic of the screen printing approach [BBH01]. A screen 434 made of polyester fabric is placed above the HTL layer at a pre-determined gap, called a snap-off distance 432. A photoresist layer is coated onto the screen and photolithographically patterned as shown 436. Deposition of an EL pattern is screen printed by applying a soft rubber squeegee 438 over a solution of EL material 439.

Repeating the screen printing process with properly patterned photoresist layer render the discretely printed R, G, and B patterns.

FIG. 3(f) to FIG. 3(h) highlight development of a full color OLED device through successive applications of photolithographic process whose success is hinged upon the invention of a new photoresist which includes a photoacid generating material and heat labile monomers [She01]. The photoacid generating material releases acid when exposed to light. After light exposure (448, FIG. 3(f)), the photoresist 442 is heated to a predetermined temperature and the monomers are joined by acid labile links to form a polymer. A special feature of this polymer is its solubility in a solvent not containing water and active hydrogen. FIG. 3(g) shows a photolithographically patterned photoresist 452 over layers of cathode 444 and an EL material 446. Reactive ion etching is then applied to remove the unprotected portion of the cathode and EL layer, creating a needed EL pattern. The remaining photoresist 452 is finally removed. Note that the need of an etching process like the reactive ion etching prevents the inclusion of the HIL and HTL layers in the OLED devices. After creation of one EL pattern, layers of the EL material of second type 466, cathode 464, and photoresist 462 are deposited as shown in FIG. 3(h). The same photolithography plus etching process is repeated to create a second EL pattern.

From above review, the thermal transfer method seems most feasible, competitive, and mature. The methods of electrochemical polymerization and photolithography using UV curable electroluminescent polymers require specially synthesized EL polymers, possibly resulting in compromised electroluminescence efficiency. One additional drawback of the electrochemical polymerization method is its exclusion of the use of HIL and HTL layers in device design and optimization. The same limitation preventing usage of HIL and HTL layers exists in the method of photolithography based on a new photoresist of a photoacid generating material and heat labile monomers. In its early development stage, the screen printing method still has rooms for improvement in resolution and in the on/off current ratio of the OLED devices such made.

Accordingly, by utilizing a directional spin coating technology, the present invention proposes a method for fabrication of OLED array which overcomes the aforementioned inability of the conventional spin coating for fabricating full color OLEDs, wherein the superiorities of simplicity and low-cost of the spin coating method are still maintained.

SUMMARY OF THE INVENTION

The primary objective of the present invention is to provide a method of fabricating OLED array which can obviously reduce the fabrication cost, simplify the fabrication process and promote the competitiveness of OLED in the market.

Another objective of the present invention is to provide a method of fabricating OLED array which enjoys the same benefits of low cost and simplicity as the conventional spin coating method but without its limitation to only monochrome OLED.

The approach to achieving the aforementioned objectives of the present invention is the utilization of a directional spin coating technology to linearly coat different organic light-emitting materials to accomplish the fabrication of full color OLED.

In the method of fabricating OLED array of the present invention, one embodiment thereof comprises: providing a substrate, whereon multiple anodes are arranged in rows; forming multiple parallel insulating banks which are perpendicular to the anodes; utilizing the directional spin coating method to coat a light-emitting layer between two neighboring insulating banks; and forming cathodes on the substrate.

Another embodiment of the present invention comprises: providing a substrate; forming pixelized anodes on the substrate; forming multiple parallel insulating banks; utilizing the directional spin coating method to coat a light-emitting layer between two neighboring insulating banks; and forming a patterned cathode on the substrate.

To further understand the objectives, technical contents, and accomplishments of the present invention, a detailed description, with the aid of drawings of the embodiments, is stated below.

BRIEF DESCRIPTION OF THE DRAWINGS

FIG. 2(a) is the schematic diagram of a conventional stack structured full color OLED display device.

FIG. 2(b) is the schematic diagram of a conventional parallel structured full color OLED display device.

FIG. 3(f) to FIG. 3(h) highlight development of a full color OLED through successive applications of photolithographic process using a specially prepared photoresist made of a photoacid generating material and heat labile monomers.

FIG. 5(a) to FIG. 5(d) are the schematic diagrams of the steps of the fabrication process according to the present invention.

FIG. 7(a) to FIG. 7(c) are the schematic sectional views according to the steps of the fabrication process of the present invention when the light emitter is a multiple-layer one.

DETAILED DESCRIPTION OF THE INVENTION

The present invention pertains to a method which utilizes a directional spin coating technology to fabricate monochrome or full color OLED array.

Figure 4:
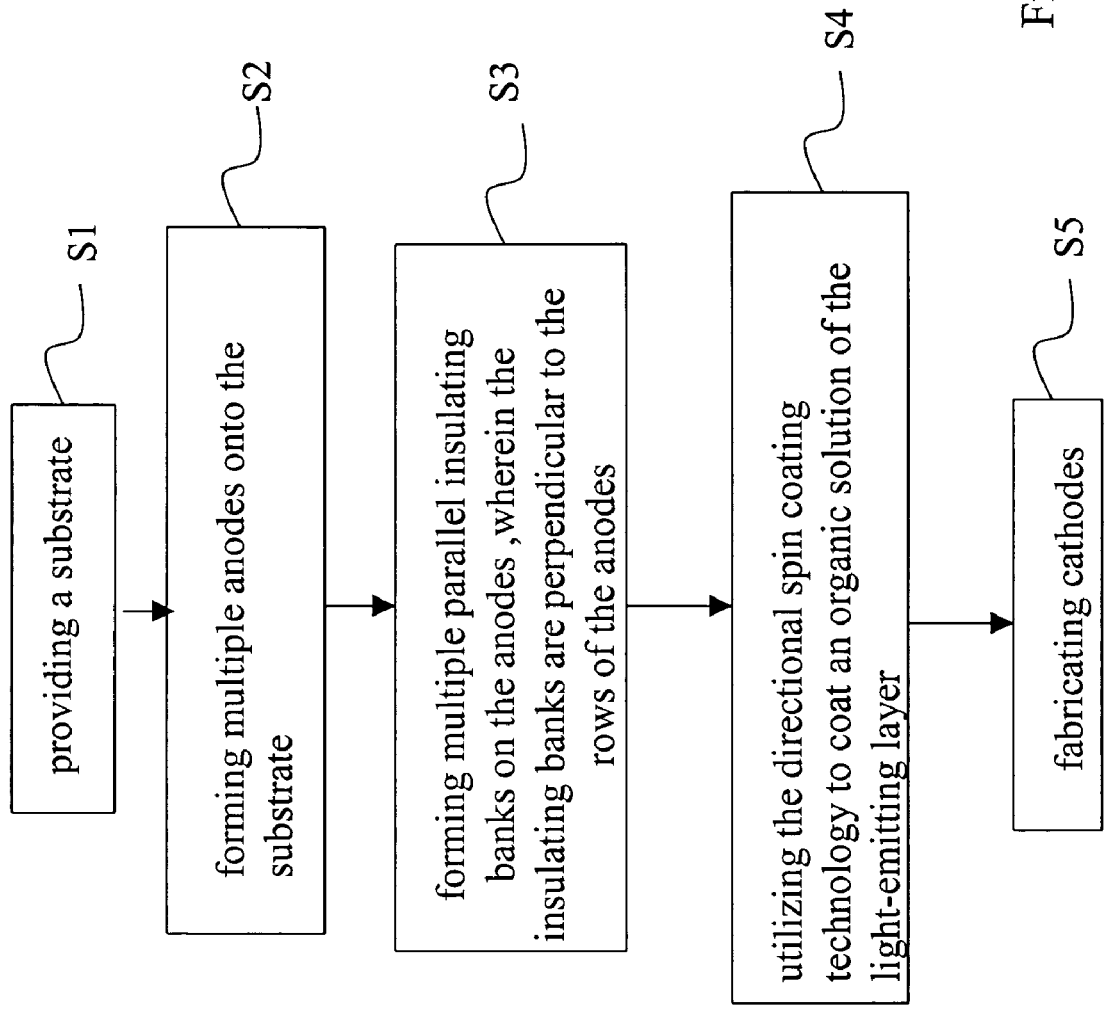
FIG. 4 is the flowchart of the fabrication process according to the present invention.
Figure 5B:
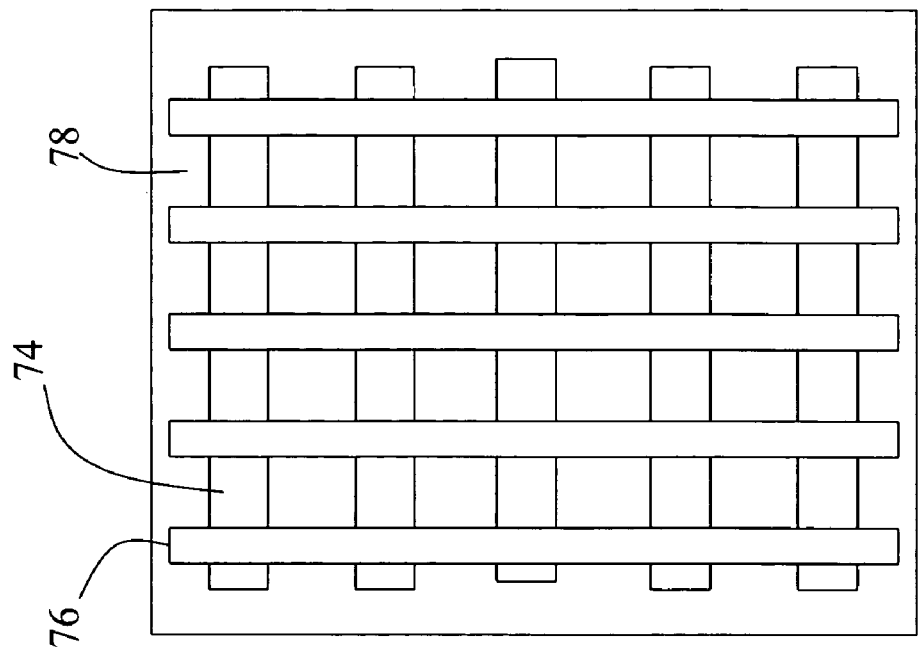
Figure 5A:
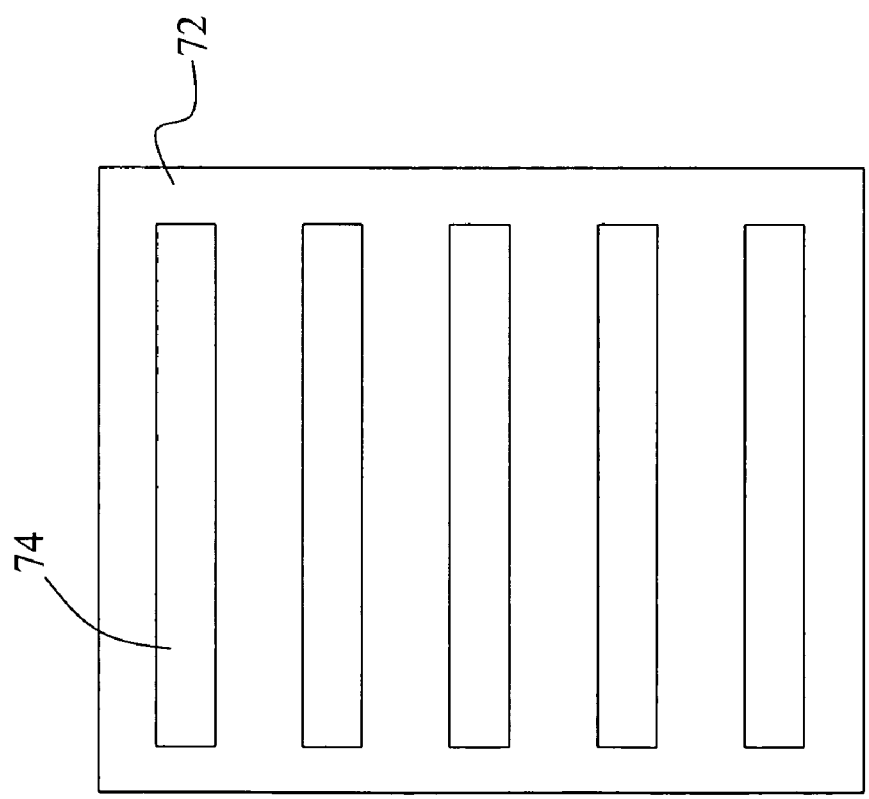
Figure 5C:
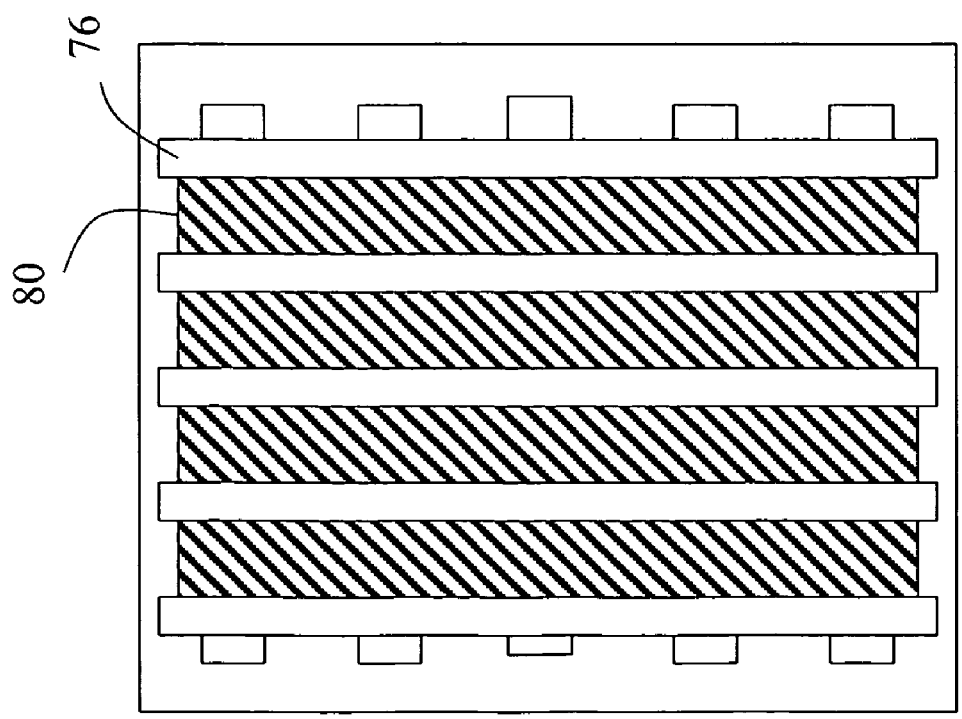

Firstly, the fabrication of passive matrix OLED array is described herein. Refer to FIG. 4 for the flowchart of fabrication process of the present invention. The fabrication process of the passive matrix OLED array comprises the following steps: providing a substrate 72 (step S1), which may be a glass or a general transparent material such as a transparent plastic; forming multiple anodes 74, which are arranged in rows, onto the substrate 72 (step S2), wherein the material of the anode 74 is not limited to a metallic material or a metallic compound but can also be an electrically conductive polymeric material, as showing in FIG. 5(a); forming multiple parallel insulating banks 76 on the anodes 74 (step S3), wherein the insulating banks are perpendicular to the rows of the anodes and two neighboring insulating banks define a trench 78, as shown in FIG. 5(b), and wherein the insulating banks 76 are not only needed in the directional spin coating of the next step and but also provide an electrically insulating function, and wherein any dielectric material, which can be patterned and will not harm the anodes 74 disposed there below in the patterning process, can be adopted as the material of the insulating banks 76; utilizing the directional spin coating technology to coat an organic solution of the light-emitting layer 80 on the trenches 78 defined by the insulating banks 76 to form light-emitting layers 80 arranged in columns (step S4), as shown in FIG. 5(c); and fabricating cathodes 82 (step S5), which can be achieved via forming stripe-like cathodes 82 on the light-emitting layers 80 as shown in FIG. 5(d1) or via utilizing a non-directional deposition method such as thermal evaporation to form the cathode 82 on the substrate 72 as shown in FIG. 5(d2) wherein the concern of electrical short between neighboring columns of cathodes 82 does not exist because of the presence of the insulating banks 76.

Figure 6A:
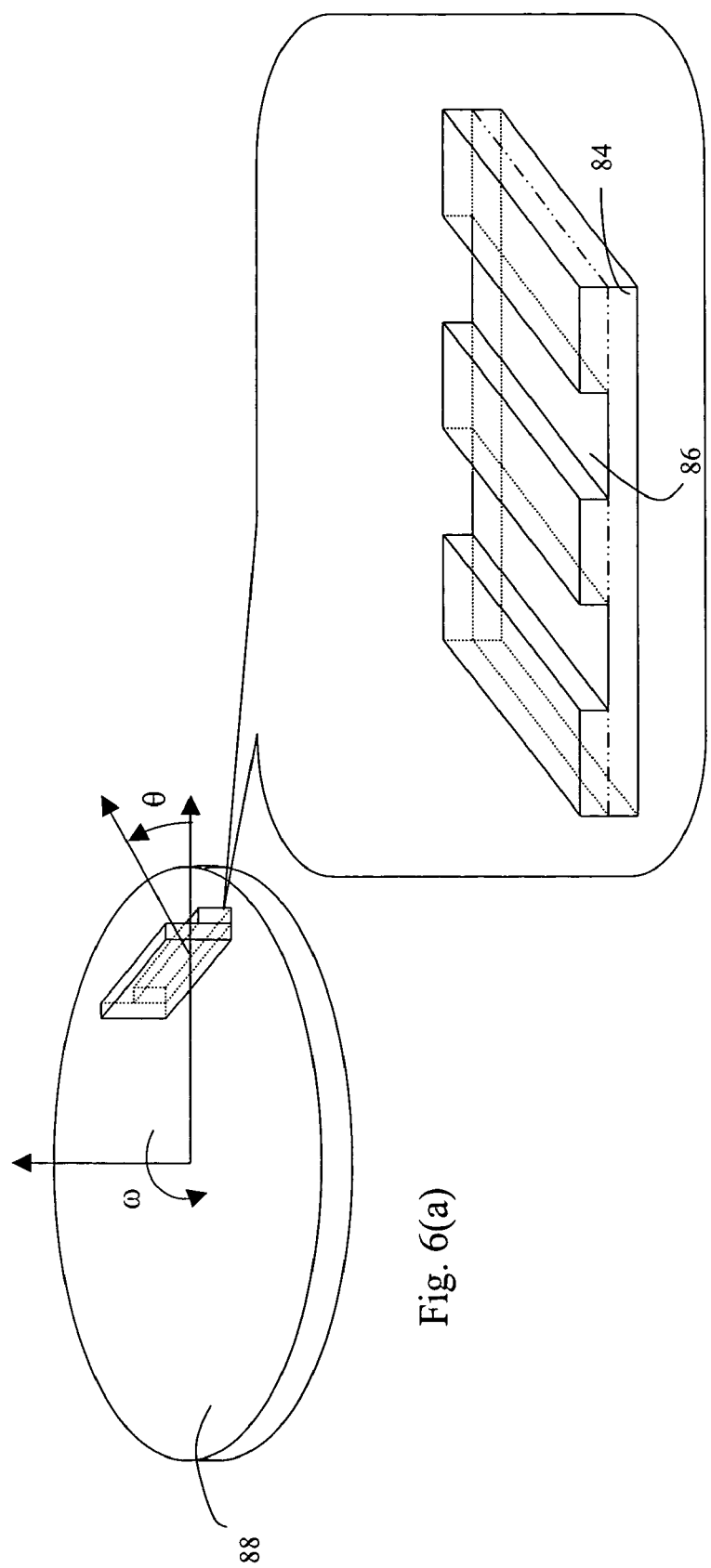
FIG. 6(a) and FIG. 6(b) are the schematic diagrams of the directional spin coating technology.
Figure 6B:
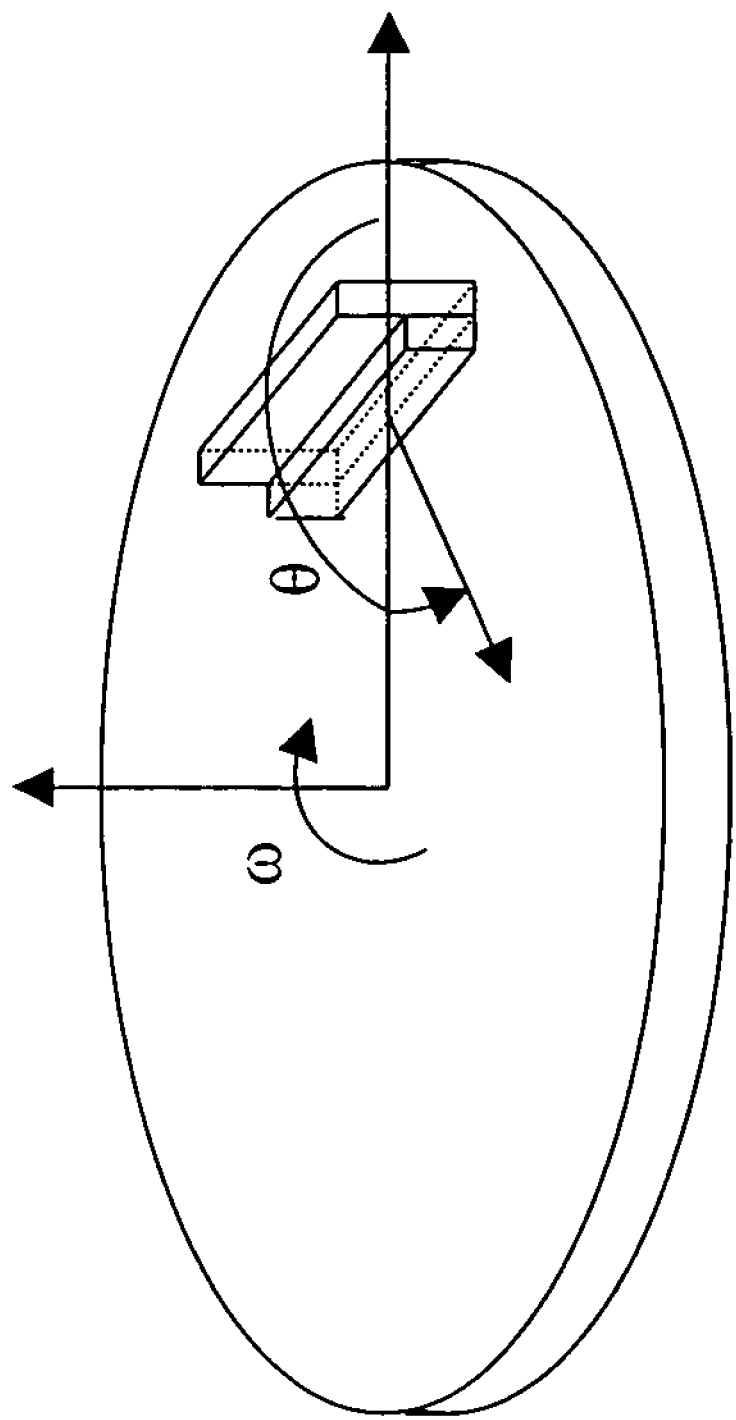

Refer to FIG. 6 for a description of the directional spin coating technology. As shown in FIG. 6(a) and FIG. 6(b), the directional spin coating technology utilizes the trenches 86, which are previously formed on a substrate 84, to define the directions and the shapes of coated solution, and in the present invention, the patterned insulating banks 76 are utilized to define the positions and shapes of the trenches 78. Next, via the angular velocity of the spin disc 88, the coating solution is efficiently coated on the substrate 84, which is fixed vertically on the spin disc 88, to achieve the patterning effect. FIG. 6(a) or FIG. 6(b) represents the relationship between $\omega$ and $\theta$ when the side of the substrate 84 with the patterned trenches 86 points outward or inward, wherein $\omega$ is the angular velocity of the rotating spin disc 88 and $\theta$ is the angle defined from the radial vector of the spin disc 88 to the normal vector of the side of the substrate 84 with the patterned trenches 86.

Figure 7C:
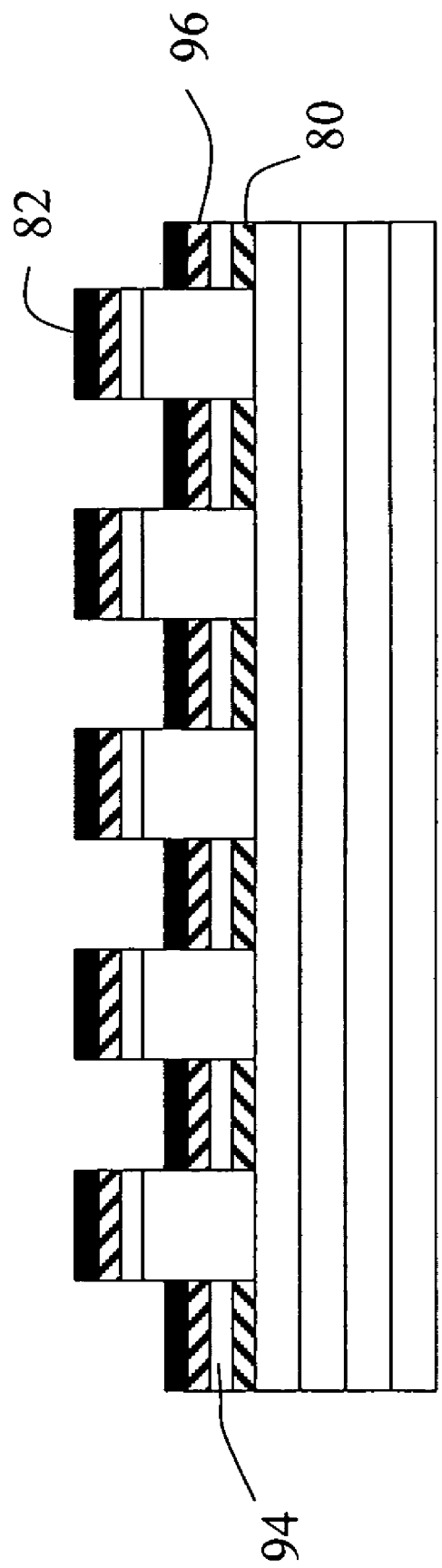

The above description relates to the fabrication of OLED with only single light-emitting layer; however, not all OLEDs have only single light-emitting layer, and thus, the multiple-layer light emitter will be further discussed herein. When the light emitter has multiple layers, it is not necessary to adopt the directional spin coating in deposition of all layers, but a mix of the directional spin coating and the non-directional conventional spin coating can also be adopted. In one embodiment thereof, firstly, a substrate 72 with multiple anodes 74 arranged in rows is provided, as shown in FIG. 7(a); then, a HIL 90, which covers the anodes 74 and the substrate 72, and a HTL 92, which is above the HIL 90, are sequentially formed via the conventional spin coating technology; then, insulating banks 76, which are parallel to each other and perpendicular to the anodes 74, are formed on the HTL 92, as shown in FIG. 7(b); then, the directional spin coating is used to perform coating on the trenches 78, which are defined by the insulating banks 76, to form the EL layers 80, which are arranged in columns, as shown in FIG. 7(c); then, another deposition technology such as the conventional spin coating is used to optionally deposit an ETL 94 on the EL layer 80 and the insulating banks 76, and to optionally deposit an EIL 96 on the ETL 94; finally, multiple stripe-like cathodes are formed on the EIL 96, or a cathode is formed to overlay the whole substrate 72, as shown in FIG. 7(c), and owing to the existence of the insulating banks 76, electrical shorts between the columns are avoided.

Figure 8B:
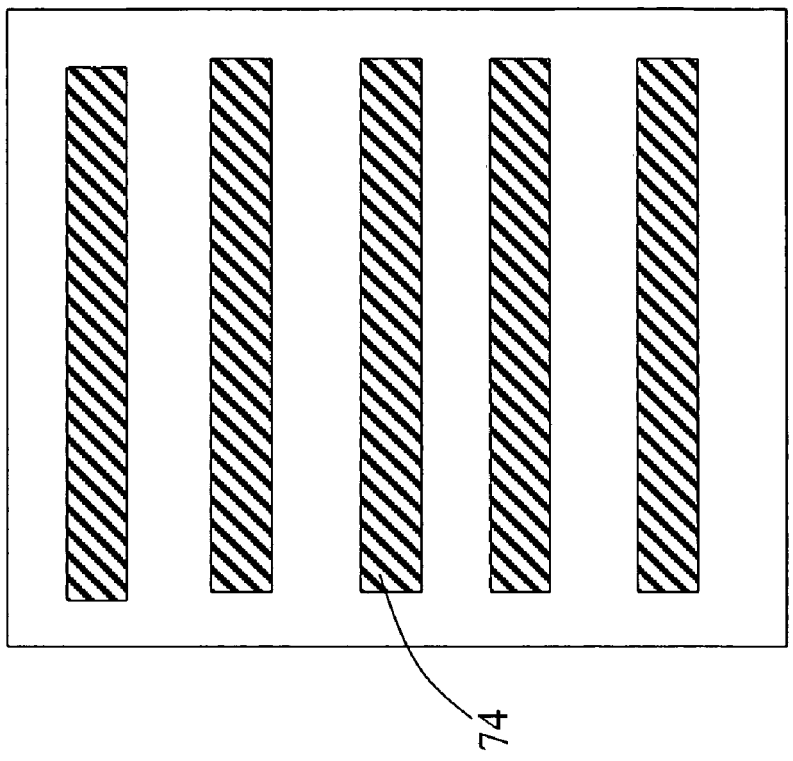
FIG. 8(b) is the schematic diagram of a stripe-like anode.
Figure 8A:
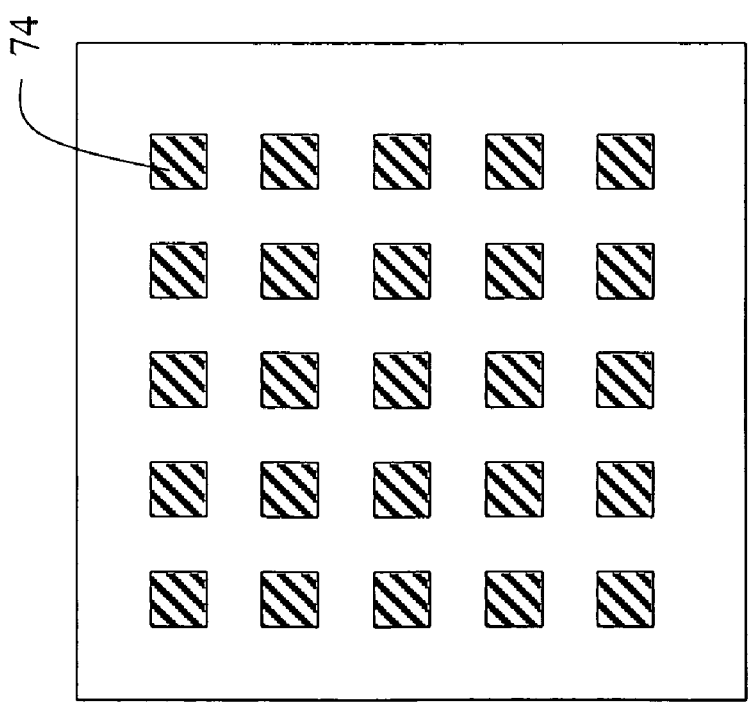
FIG. 8(a) is the schematic diagram of a pixelized anode.

The active matrix OLED can be fabricated via a slight modification of the aforementioned fabrication process of passive matrix OLED. For example, the anode 74 can be pixelized as that shown in FIG. 8(a), or can be formed into parallel rows as that shown in FIG. 8(b). In FIG. 8(a), the insulating banks need only being parallel, and are not limited to being arranged in rows or columns; next, the approach of fabricating the light emitter is unchanged and is to coat the coating solution on the trenches defined by the insulating banks via the directional spin coating technology. If the light emitter comprises multiple layers, it is to be noted that the modification of the fabrication process is the same as that mentioned above. The cathodes may be pixel-like or stripe-like. When the cathodes are stripe-like, it is necessary for the cathodes to be perpendicular to the stripe-like insulating banks lest supposedly "off" OLED elements should become switched-on when a neighboring OLED element is switched-on. In contrast, when the anodes are formed into rows as shown in FIG. 8(b), the cathodes should be deposited into pixels, and the stripe-like insulating banks must be perpendicular to the rowed anodes lest supposedly "off" OLED elements should become switched-on when a neighboring OLED element is switched-on. There are many available existing technology for fabricating pixelized anodes or cathodes, and they will not be stated herein.

Figures 1, 1A:
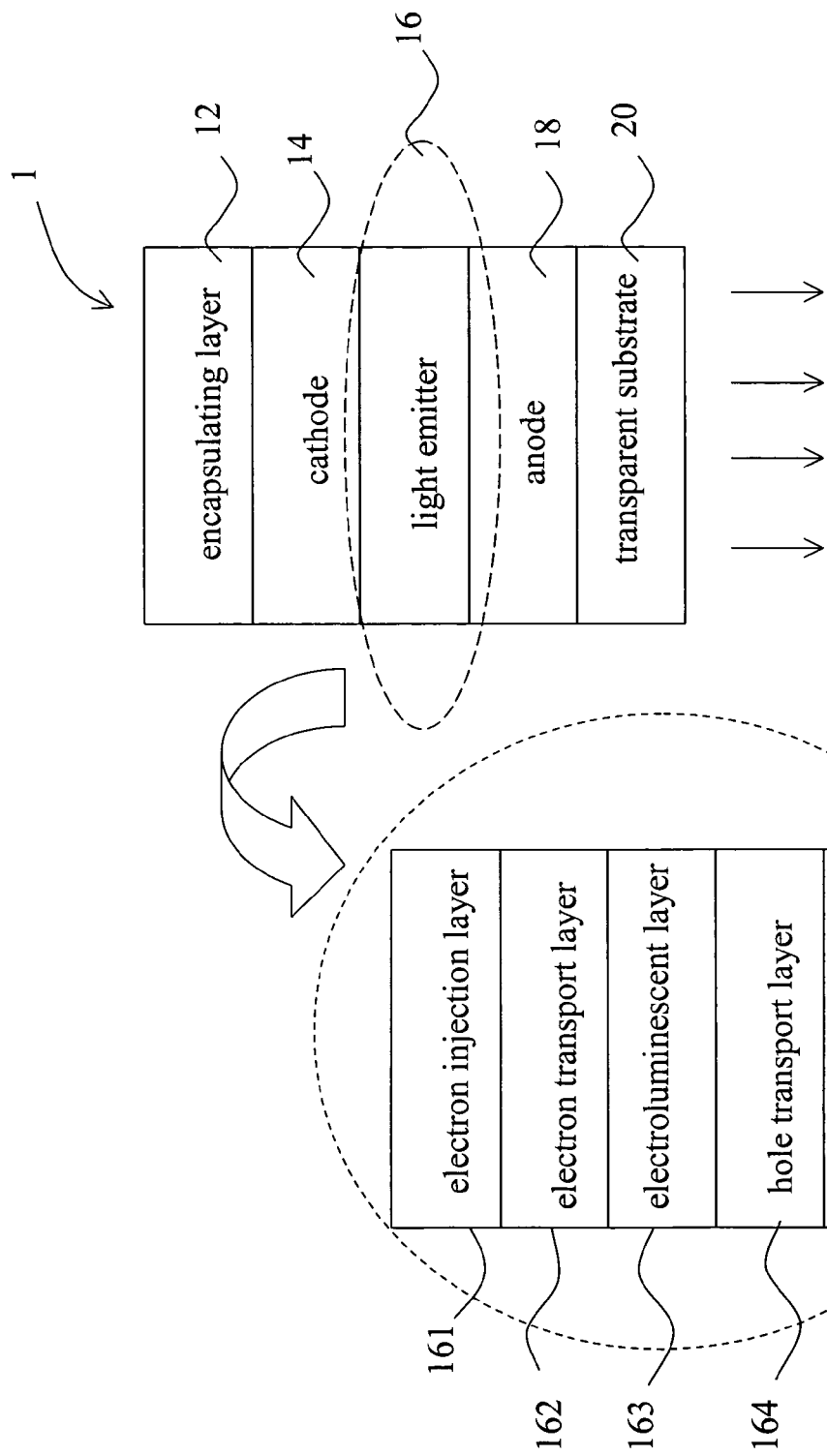
FIG. 1 is the schematic diagram of a general conventional OLED.
FIG. 1(a) is the schematic diagram of a conventional multiple-layer light emitter.
Figures 2C, 2D:
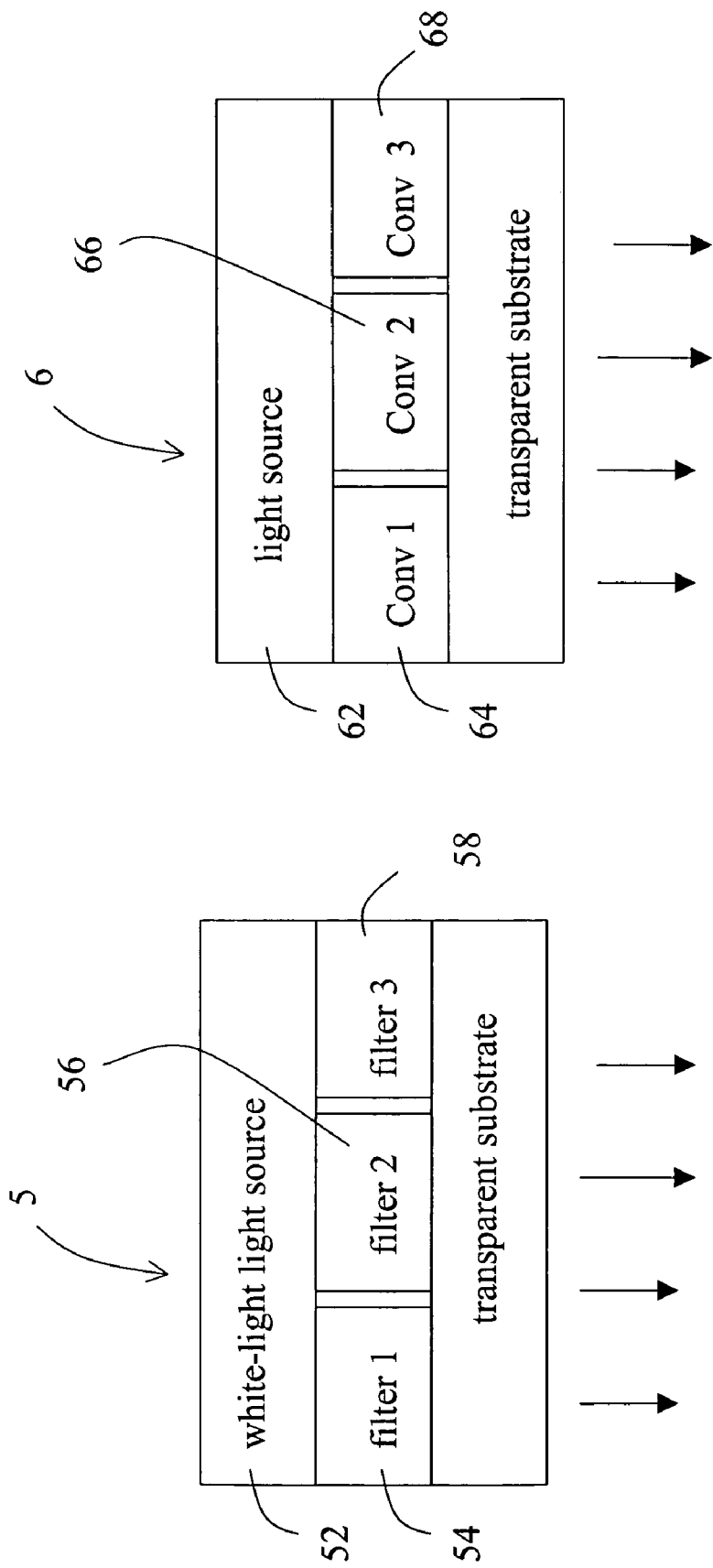
FIG. 2(c) is the schematic diagram of another conventional parallel structured full color OLED display device
FIG. 2(d) is the schematic diagram of yet another conventional parallel structured full color OLED display device.
Figure 3A:
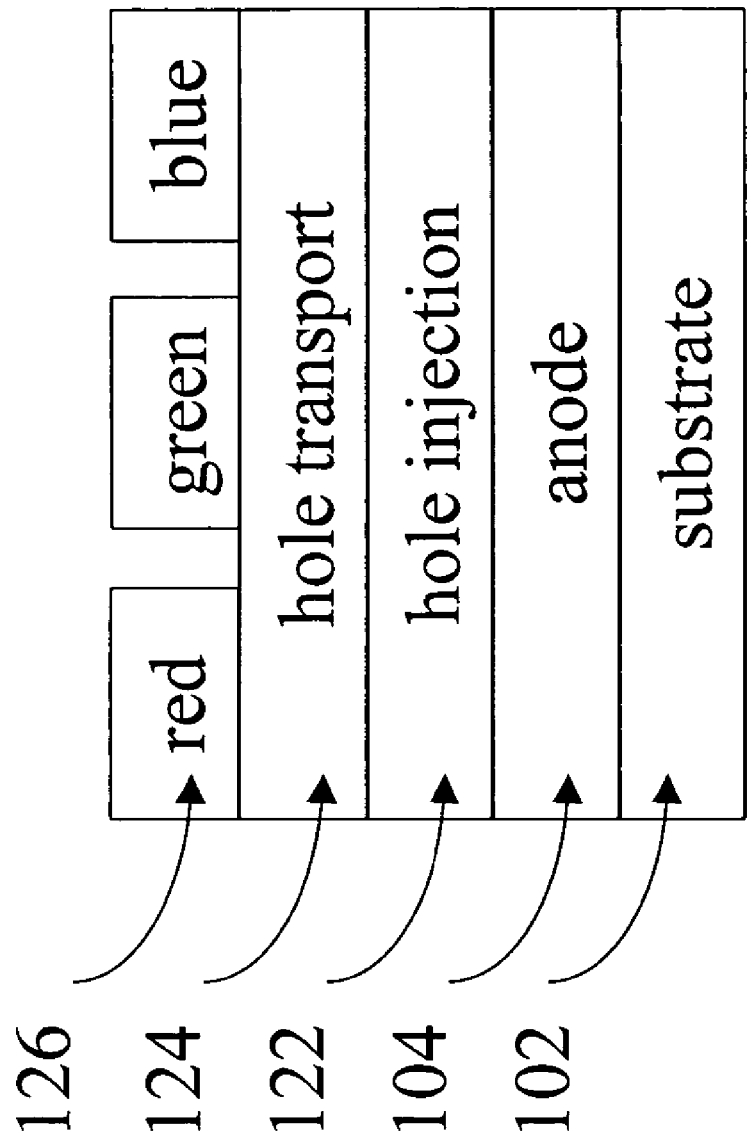
FIG. 3(a) is the schematic diagram of a half complete, parallel structured, full color OLED.
Figure 3B:
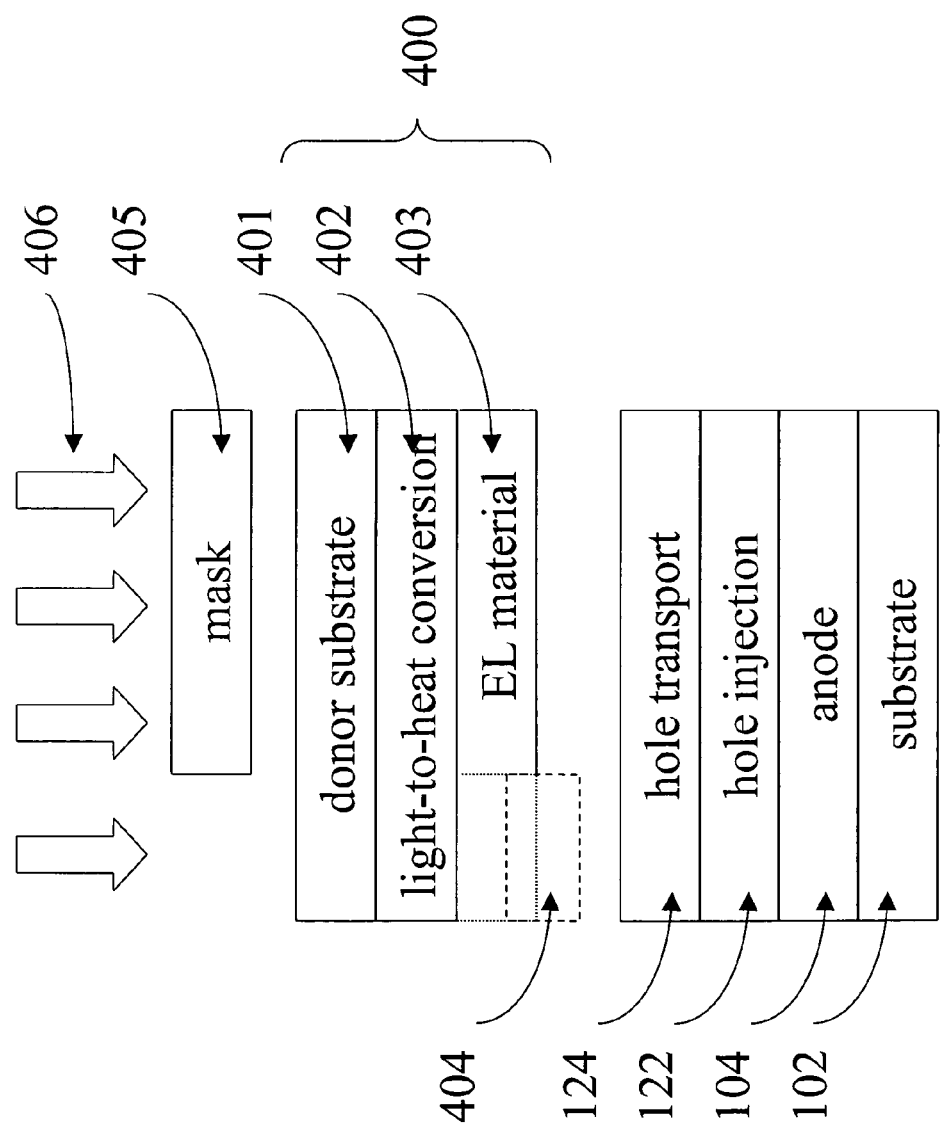
FIG. 3(b) is an illustration of the thermal transfer method for fabrication of full color OLED.
Figure 3C:
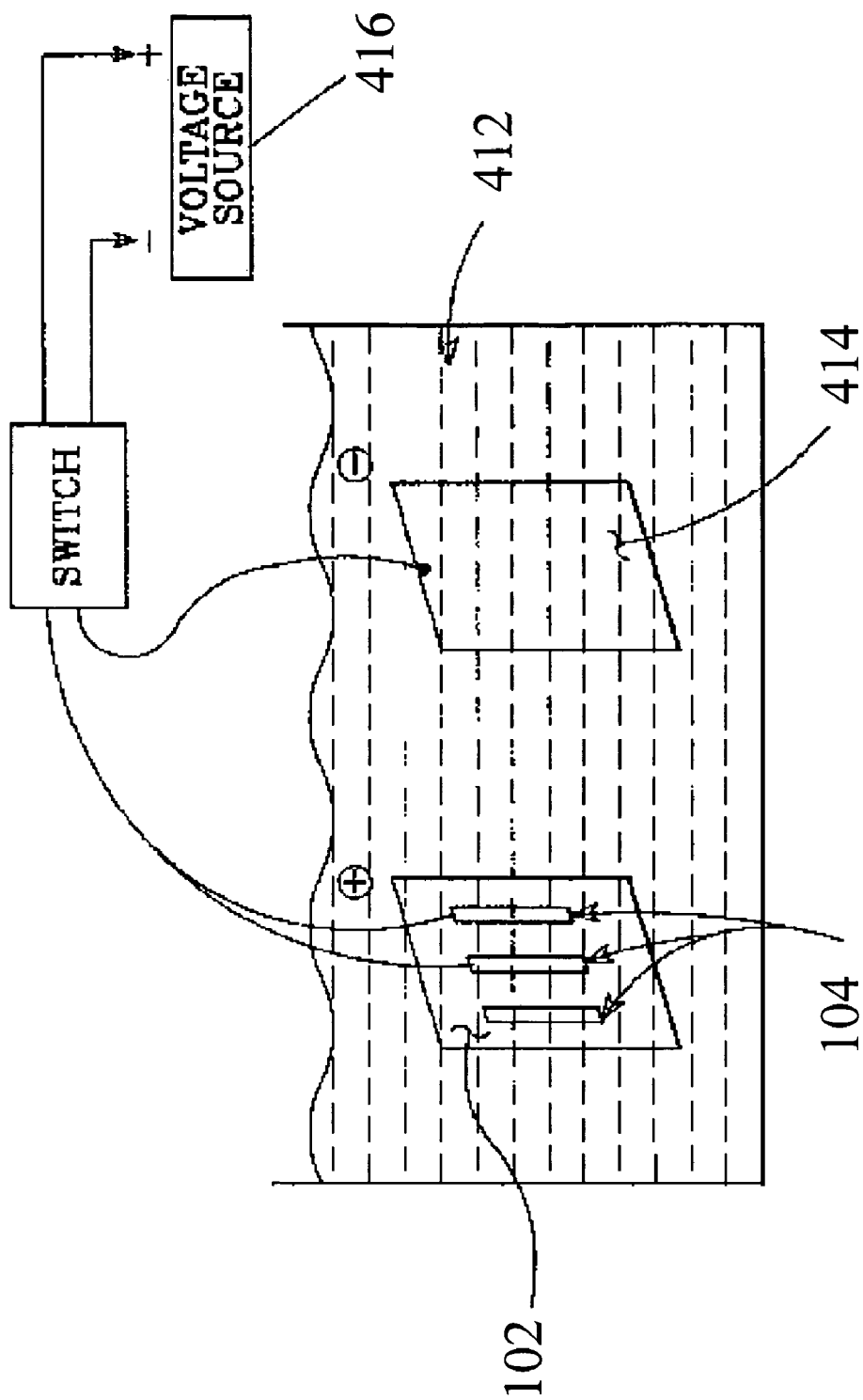
FIG. 3(c) is an illustration of the electrochemical polymerization method for fabrication of full color OLED.
Figure 3D:
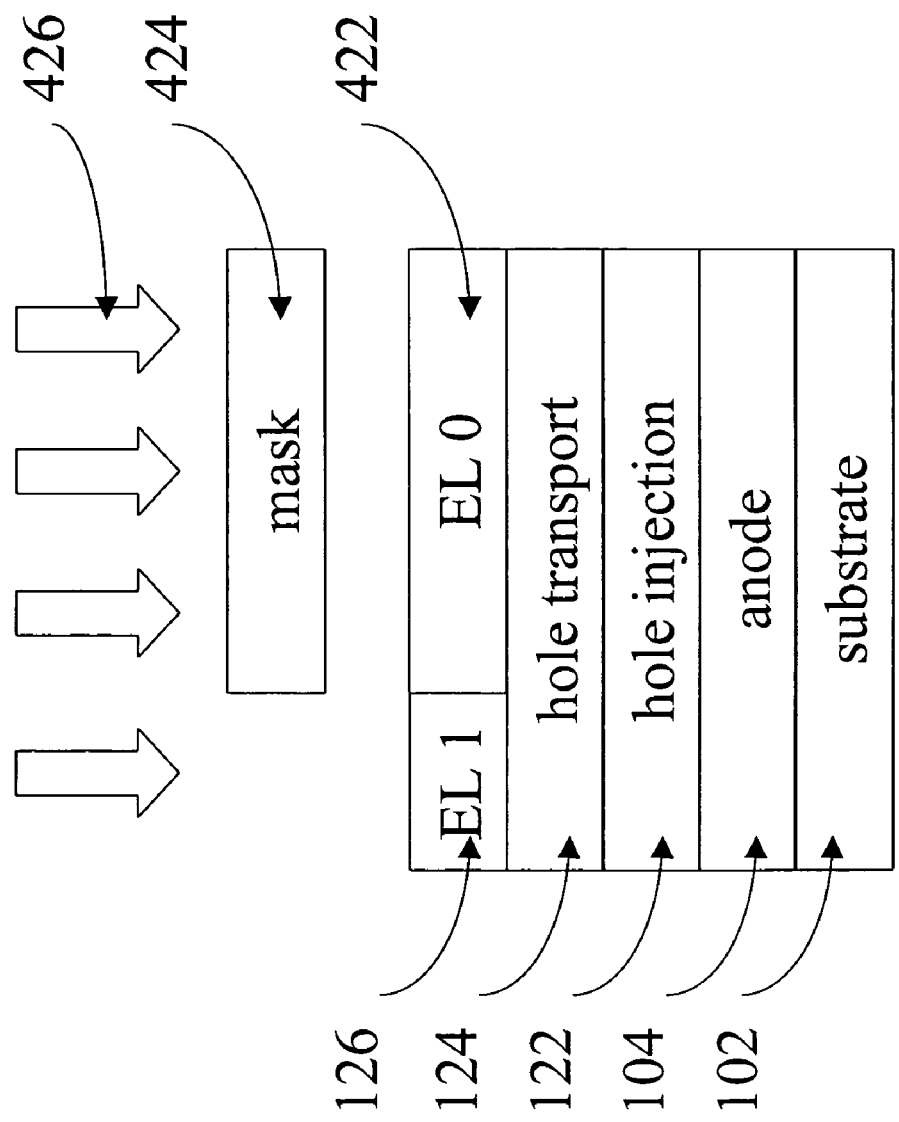
FIG. 3(d) is an illustration of the photolithographical method for fabrication of full color OLED using UV curable EL polymers.
Figure 3E:
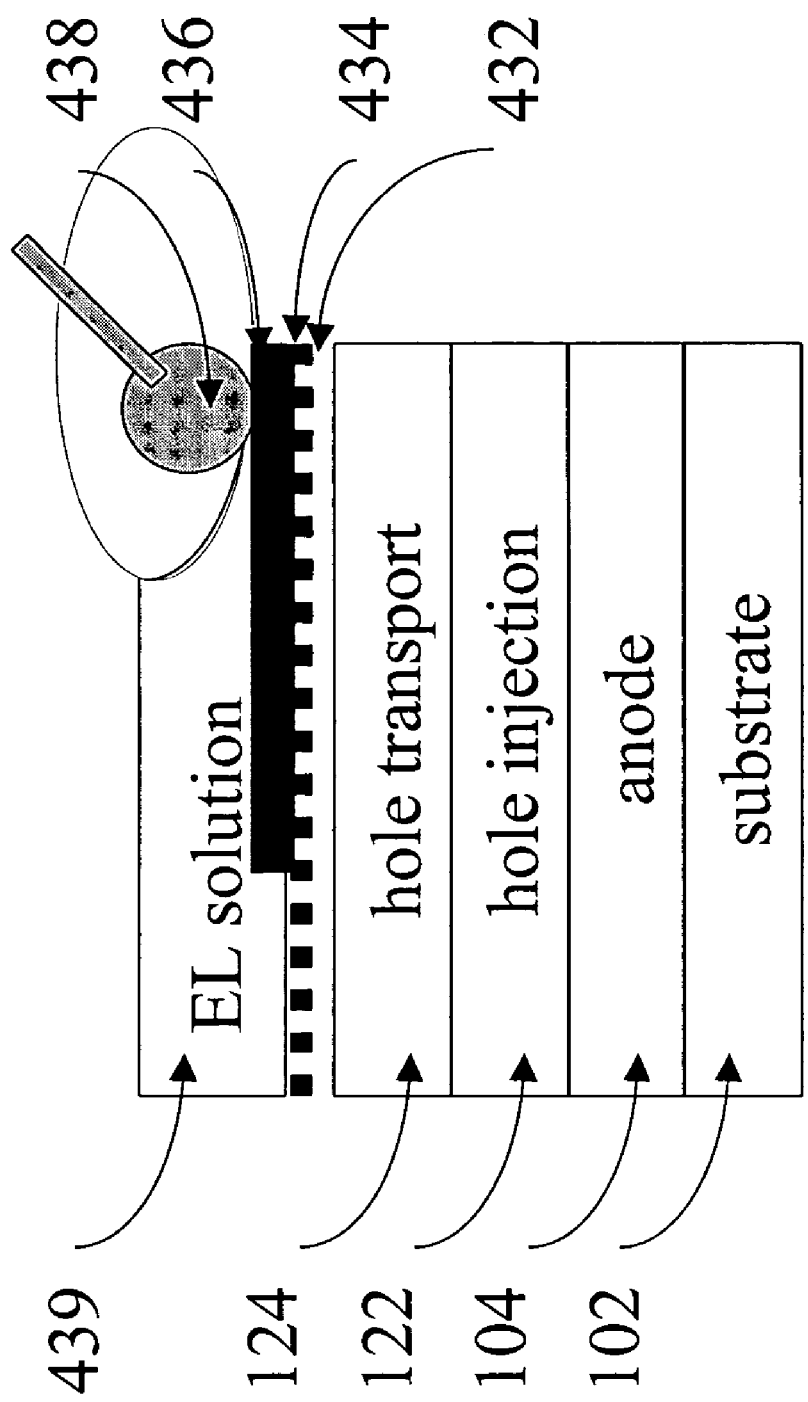
FIG. 3(e) is an illustration of the screen printing method for fabrication of full color OLED.
Figure 3H:
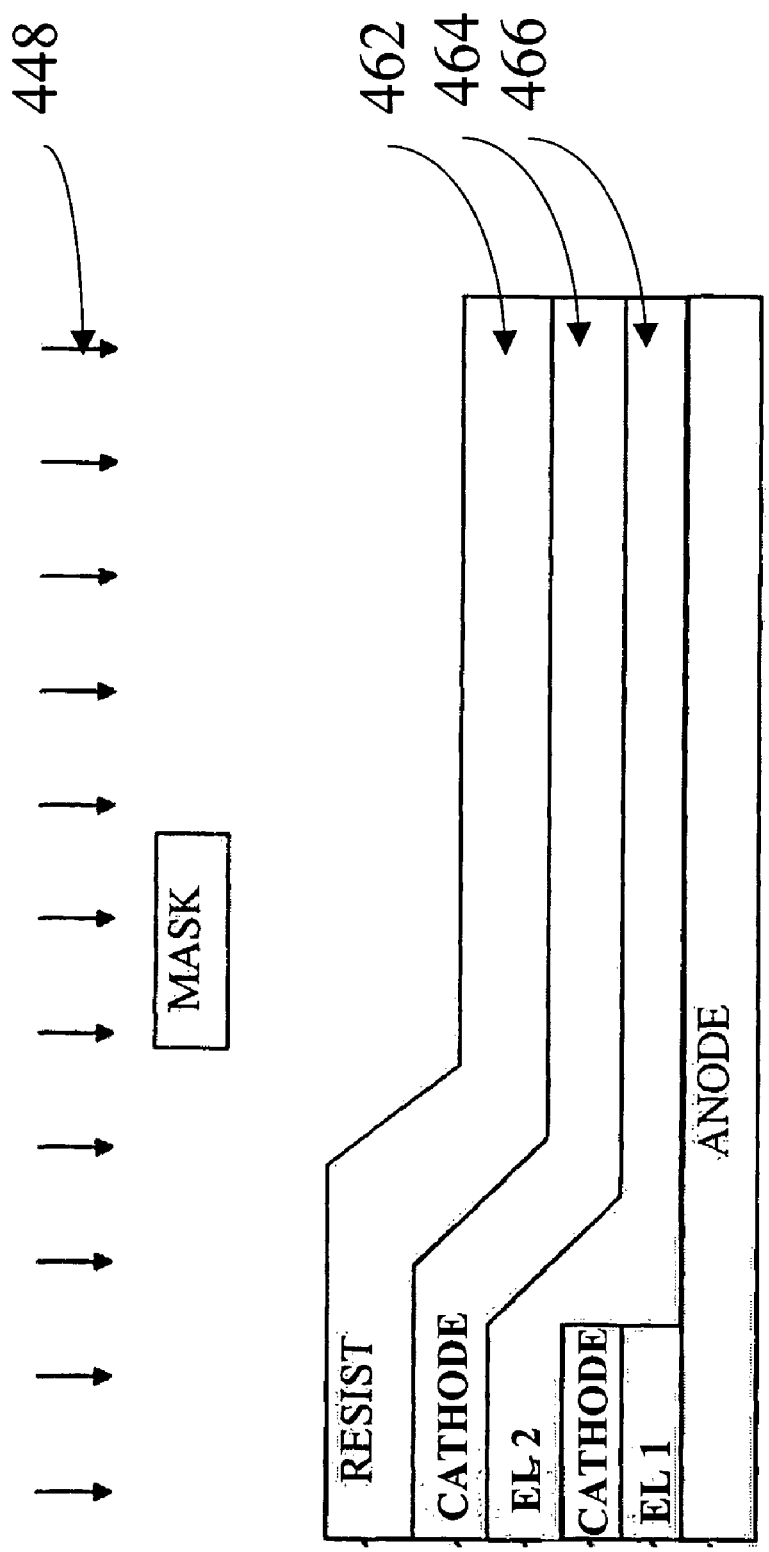

In full color OLED, the light emitters must be able to emit R, G, and B lights separately, and thus, the organic solutions of R, G, and B, which are to be filled into the trenches defined by the insulating banks via the directional spin coating, are to be disposed repeatedly according to the sequence of R-G-B or R-B-G in order to accomplish the parallel structured full color OLED display device shown in FIG. 2(b).

In summary, the present invention provides a method of fabricating OLED array, wherein the directional spin coating technology is adopted to overcome the problem that the conventional spin coating technology cannot fabricate full color OLED, and wherein a low-cost monochrome/full color OLED is fabricated with a simpler process in order to obviously promote OLED's competitiveness in the market.

Those described above are only the preferred embodiments of the present invention, and any equivalent modification and variation in the shapes, structures, characteristics, and spirit stated inside the claims of the present invention are to be included within the scope of the claims of the present invention.

What is claimed is:

1. A method of fabricating organic light emitting diode array, comprising:

providing a substrate having a first side;

forming a plurality of anodes, which are arranged in parallel rows, on said first side;

forming a plurality of insulating banks, which are parallel to each other and perpendicular to said anodes, on said first side;

disposing said substrate vertically on a spin disc and utilizing a directional spin coating technology to coat an organic light-emitting layer on each trench defined by two neighboring said insulating banks;

wherein said first side faces either inward towards or outward from the center of said spin disc;

wherein said spin disc is rotated at an angular velocity; and forming at least one cathode on said first side.

2. The method of fabricating organic light emitting diode array according to claim 1, wherein the material of said insulating banks may be any dielectric material that can be patterned and will not harm said anodes during the patterning process.

3. The method of fabricating organic light emitting diode array according to claim 1, wherein said cathode is formed on said light-emitting layer and represents a pixel-like shape or a stripe-like shape, or overlays the whole surface of said substrate.

4. The method of fabricating organic light emitting diode array according to claim 1, wherein if a hole injection layer, a hole transport layer, an electron transport layer, or an electron injection layer, is additionally installed to said organic light-emitting layer for increasing the light-emitting efficiency of said diode, said additional injection or transport layer may be formed via said directional spin coating technology or another appropriate existing fabrication process.

5. A method of fabricating organic light emitting diode array, comprising:
    providing a substrate having a first side;
    forming a pixelized anode on said first side;
    forming a plurality of insulating banks, which are parallel to each other, on said first side;
    disposing said substrate vertically on a spin disc and utilizing a directional spin coating technology to coat an organic light-emitting layer on each trench defined by two neighboring said insulating banks;
    wherein said first side faces either inward towards or outward from the center of said spin disc;
    wherein said spin disc is rotated at an angular velocity; and
    forming at least one cathode on said first side.

6. The method of fabricating organic light emitting diode array according to claim 5, wherein the material of said insulating banks may be any dielectric material that can be patterned and will not harm said anode during the patterning process.

7. The method of fabricating organic light emitting diode array according to claim 5, wherein said cathode is formed on said organic light-emitting layer and represents a pixel-like shape or a stripe-like shape that is perpendicular to said organic light-emitting layer.

8. The method of fabricating organic light emitting diode array according to claim 5, wherein if a hole injection layer, a hole transport layer, an electron injection layer, or an electron transport layer is additionally installed to said light-emitting layer for increasing the light-emitting efficiency of said diode, said additional injection or transport layer may be formed via said directional spin coating technology or another appropriate existing fabrication process.

9. A method of fabricating organic light emitting diode array, comprising:
    providing a substrate having a first side;
    forming a plurality of anodes, which are arranged in parallel rows, on said first side;
    forming a plurality of insulating banks, which are parallel to each other and perpendicular said anodes, on said first side;
    disposing said substrate vertically on a spin disc and utilizing a directional spin coating technology to coat an organic light-emitting layer on each trench defined by two neighboring said insulating banks;
    wherein said first side faces either inward towards or outward from the center of said spin disc;
    wherein said spin disc is rotated at an angular velocity; and
    forming pixelized cathodes on said first side.

10. The method of fabricating organic light emitting diode array according to claim 9, wherein the material of said insulating banks may be any dielectric material that can be patterned and will not harm said anode during the patterning process.

11. The method of fabricating organic light emitting diode array according to claim 9, wherein said cathodes are pixelized on said organic light-emitting layer.

12. The method of fabricating organic light emitting diode array according to claim 9, wherein if a hole injection layer, a hole transport layer, an electron injection layer, or an electron transport layer is additionally installed to said light-emitting layer for increasing the light-emitting efficiency of said diode, said additional injection or transport layer may be formed via said directional spin coating technology or another appropriate existing fabrication process.

* * * * *